US008502606B2

United States Patent
Kim et al.

(10) Patent No.: US 8,502,606 B2
(45) Date of Patent: Aug. 6, 2013

(54) POWER AMPLIFYING APPARATUS WITH DUAL-CURRENT CONTROL MODE

(75) Inventors: Youn Suk Kim, Gyunggi-do (KR); Jun Kyung Na, Gyunggi-do (KR); Sang Hoon Ha, Gyunggi-do (KR); Shinichi Iizuka, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 40 days.

(21) Appl. No.: 13/324,286

(22) Filed: Dec. 13, 2011

(65) Prior Publication Data

US 2013/0076445 A1  Mar. 28, 2013

(30) Foreign Application Priority Data

Sep. 22, 2011  (KR) .................. 10-2011-0095753

(51) Int. Cl.
  *H03F 3/04* (2006.01)
(52) U.S. Cl.
  USPC .......................................... 330/296; 330/285
(58) Field of Classification Search
  USPC .................................... 330/285, 296
  See application file for complete search history.

(56) References Cited

U.S. PATENT DOCUMENTS

| 5,065,055 A | 11/1991 | Reed |
| 5,789,984 A * | 8/1998 | Davis et al. ............... 330/279 |
| 6,239,659 B1 * | 5/2001 | Grassle ..................... 330/282 |
| 6,265,942 B1 * | 7/2001 | Grassle ..................... 330/282 |
| 7,515,000 B1 * | 4/2009 | Jin et al. .................. 330/279 |
| 2011/0025422 A1 | 2/2011 | Marra et al. |

FOREIGN PATENT DOCUMENTS

| KR | 1996-0006633 B1 | 5/1996 |
| KR | 10-2010-0073877 A | 7/2010 |
| KR | 10-2011-0058545 A | 6/2011 |

OTHER PUBLICATIONS

Korean Office Action, and English translation thereof, issued in Korean Patent Application No. 10-2011-0095753 dated Aug. 8, 2012.

* cited by examiner

*Primary Examiner* — Henry Choe
(74) *Attorney, Agent, or Firm* — McDermott Will & Emery LLP

(57) ABSTRACT

There is provided a power amplifying apparatus with dual-current control mode, including: a transistor mirror circuit adjusting currents respectively flowing through a main path and a mirror path connected in parallel to a power source terminal; a resistor mirror circuit adjusting the respective currents of the main path and the mirror path; a current controlling unit controlling a control current flowing through the main path with a pre-set constant current; a voltage adjusting unit providing a bias adjustment signal that corresponds to a difference voltage between a first voltage of a first node on the main path to which a current is output from the resistor mirror circuit and a second voltage of a second node on the mirror path to which a current is output from the resistor mirror circuit; and a bias circuit unit adjusting a bias of a power amplifying unit.

14 Claims, 2 Drawing Sheets

POWER AMPLIFYING APPARATUS WITH DUAL-CURRENT CONTROL MODE

CROSS-REFERENCE TO RELATED APPLICATIONS

This application claims the priority of Korean Patent Application No. 10-2011-0095753 filed on Sep. 22, 2011, in the Korean Intellectual Property Office, the disclosure of which is incorporated herein by reference.

BACKGROUND OF THE INVENTION

1. Field of the Invention

The present invention relates to a power amplifying apparatus having a dual-current control mode, which operates in one of two different current control modes according to a control current magnitude.

2. Description of the Related Art

In general, a power amplifier module (PAM) adjusts output power by adjusting the amount of current flowing in a main stage. Namely, the current flowing through the main stage flows through a power p-type metal-oxide-semiconductor field-effect transistor (PMOS FET) of a main low dropout (LDO) regulator, and here, the amount of current flowing into a drain and a source of the PMOS FET may be adjusted by adjusting a current sensor.

In the related art, a bias control circuit of the PAM using the main LDO regulator includes a current mirror circuit and an operational amplifier in order to control a bias.

Here, the current mirror circuit may include a transistor mirror circuit adjusting a bias current by using a transistor and a resistor mirror circuit adjusting a bias current by using a resistance ratio.

First, the existing transistor mirror circuit has a current control scheme using a metal-oxide-semiconductor field-effect transistor (MOS FET). Namely, this scheme uses a concept in which, in two MOS FETs, i.e., first and second MOS FETs, forming a current mirror circuit, when a gate voltage Vg, a source voltage Vs, and a drain voltage Vd are equal, the ratio between currents flowing in the respective first and second MOS FETs is constant.

Namely, a feedback loop is formed such that bias voltages of the two first and second MOS FETs are equal, the gate voltage Vg and the source voltage Vs are commonly applied, and drain voltages Vd1 and Vd2 of the two first and second MOS FETs are equal. Here, when a control current is adjusted, a current Ipa of an RF amplifier may be adjusted by the ratio between the sizes of the MOS FETs.

However, the following problem may be encountered in the case of a transistor mirror circuit. That is, when an RF signal is applied in a state in which the drain to source voltage Vds of the first or second MOS FET is low, the RF signal is rectified to generate a DC component, distorting the current ratio between the first and second MOS FETs.

In order to solve the problem of the related art, when the drain-to-source voltage Vds is increased to be as high as about 0.6V, a loss of power may be generated by a voltage drop.

Next, the existing resistor mirror circuit uses a concept in which a current ratio may be adjusted according to a resistance ratio when the voltages across first and second resistors are equal.

Namely, a feedback loop is formed such that voltages applied to the first and second resistors are equal, a control voltage is common, and first and second voltages V1 and V2 formed at the other ends of the first and second resistors are equal.

However, the resistor mirror circuit has a problem in which, in a case in which the voltage applied to the second resistor R2 is intended to be reduced to enhance power efficiency, if a second resistance is low, a very low voltage may be applied when current flowing in a power amplifier is low.

For example, if a voltage drop of 0.1V is generated in the second resistor R2 when a current of 1 A flows across the second resistor R2, only 1 mV voltage is applied when 10 mA flows across the second resistor R2. Thus, in consideration of the fact that S/N must be generally 60 dB or higher, when a noise level is 1 uV or higher, it may fail to satisfy an international standard.

Differently, when resistance is increased, a large voltage drop may be generated due to high resistance, degrading output and efficiency.

SUMMARY OF THE INVENTION

An aspect of the present invention provides a power amplifying apparatus having a dual-current control mode, which operates in one of two different current control modes according to a control current magnitude.

According to an aspect of the present invention, there is provided a power amplifying apparatus including: a transistor mirror circuit adjusting currents respectively flowing through a main path and a mirror path, connected in parallel to a power source terminal, according to variable resistance varying according to a gate voltage; a resistor mirror circuit connected to the transistor mirror circuit and adjusting the respective currents of the main path and the mirror path according to a fixed resistance ratio of the main path and the mirror path; a current controlling unit controlling a control current flowing through the main path with a pre-set constant current; a voltage adjusting unit providing a bias adjustment signal that corresponds to a difference voltage between a first voltage of a first node on the main path to which a current is output from the resistor mirror circuit and a second voltage of a second node on the mirror path to which a current is output from the resistor mirror circuit; and a bias circuit unit adjusting a bias of a power amplifying unit according to the bias adjustment signal from the voltage adjusting unit.

When the control current is lower than a pre-set reference current, the transistor mirror circuit may dominantly adjust the current flowing through the mirror path over the resistor mirror circuit, and when the control current is higher than the pre-set reference current, the resistor mirror circuit may dominantly adjust the current flowing through the mirror path over the transistor mirror circuit.

The transistor mirror circuit may include: a first MOS FET formed on the main path and having a source connected to the power source terminal, a gate connected to the gate voltage, and a drain; and a second MOS FET formed on the mirror path and having a source connected to the power source terminal, a gate connected to the gate voltage, and a drain.

The first and second MOS FETs may have a pre-set gate size ratio for pre-set current mirroring.

The second MOS FET may have a gate size larger than that of the first MOS FET.

The resistor mirror circuit may include: a first resistor having one end connected to the drain of the first MOS FET; and a second resistor having one end connected to the drain of the second MOS FET.

The first and second resistors may have a pre-set resistance ratio for pre-set current mirroring.

The second resistor may have a resistance value smaller than that of the first resistor.

According to another aspect of the present invention, there is provided a power amplifying apparatus including: a transistor mirror circuit adjusting currents respectively flowing through a main path and a mirror path connected in parallel to a power source terminal, according to variable resistance varying according to a gate voltage; a resistor mirror circuit connected to the transistor mirror circuit and adjusting the respective currents of the main path and the mirror path according to a fixed resistance ratio of the main path and the mirror path; a current controlling unit controlling a control current flowing through the main path with a pre-set constant current; a voltage adjusting unit providing a bias adjustment signal that corresponds to a difference voltage between a first voltage of a first node on the main path to which a current is output from the resistor mirror circuit and a second voltage of a second node on the mirror path to which a current is output from the resistor mirror circuit; and a bias circuit unit adjusting a bias of a power amplifying unit according to the bias adjustment signal from the voltage adjusting unit, wherein the transistor mirror circuit includes a first MOS FET formed on the main path and having a source connected to the power source terminal, a gate connected to the gate voltage, and a drain, and a second MOS FET formed on the mirror path and having a source connected to the power source terminal, a gate connected to the gate voltage, and a drain, and the resistor mirror circuit includes a first resistor having one end connected to the drain of the first MOS FET and a second resistor having one end connected to the drain of the second MOS FET.

When the control current is lower than a pre-set reference current, the transistor mirror circuit may dominantly adjust the current flowing through the mirror path over the resistor mirror circuit, and when the control current is higher than the pre-set reference current, the resistor mirror circuit may dominantly adjust the current flowing through the mirror path over the transistor mirror circuit.

The first and second MOS FETs may have a pre-set gate size ratio for pre-set current mirroring.

The second MOS FET may have a gate size larger than that of the first MOS FET.

The first and second resistors may have a pre-set resistance ratio for pre-set current mirroring.

The second resistor may have a resistance value smaller than that of the first resistor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
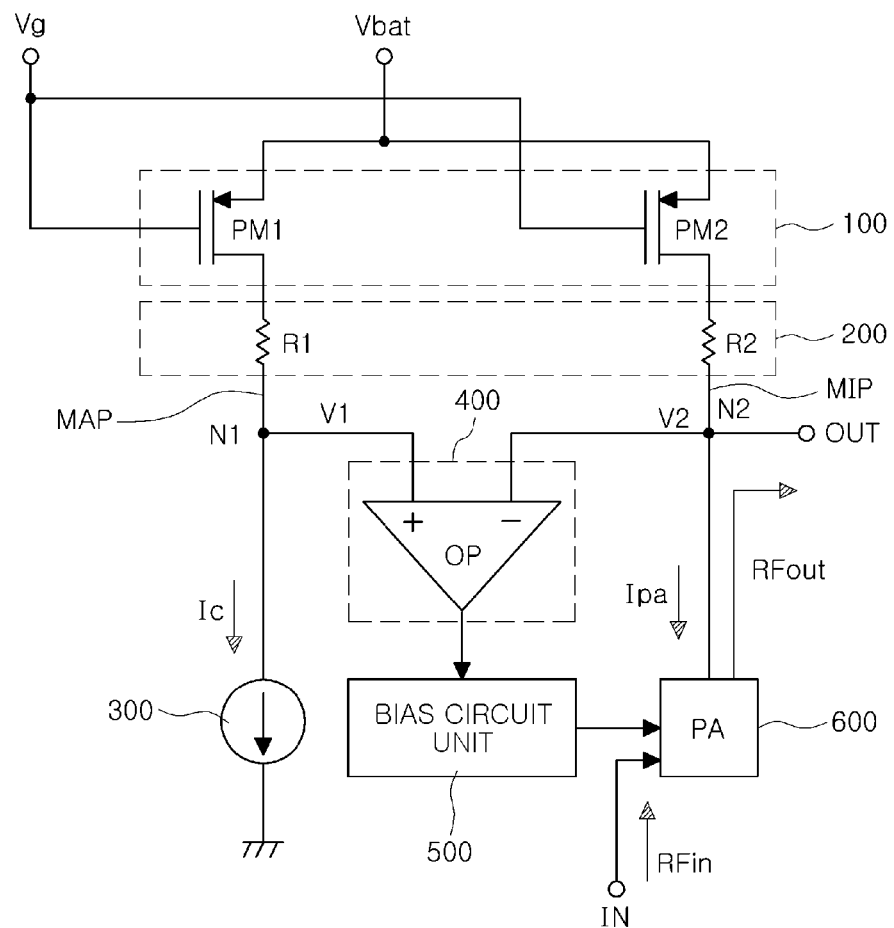
FIG. 1 is a circuit block diagram of a power amplifying apparatus according to an embodiment of the present invention.

Exemplary embodiments of the present invention will now be described in detail with reference to the accompanying drawings.

The present invention should not be construed as being limited to the embodiments set forth herein and the embodiments may be used to assist in understanding the technical idea of the present invention. Like reference numerals designate like components having substantially the same constitution and function in the drawings of the present invention.

FIG. 1 is a circuit block diagram of a power amplifying apparatus according to an embodiment of the present invention.

With reference to FIG. 1, a power amplifying apparatus according to an embodiment of the present invention may include a transistor mirror circuit 100 adjusting currents respectively flowing through a main path MAP and a mirror path MIP connected in parallel to a power source terminal Vbat providing pre-set power, according to variable resistance varying according to a gate voltage Vg, a resistor mirror circuit 200 connected to the transistor mirror circuit 100 and adjusting the respective currents of the main path MPA and the mirror path MIP according to a fixed resistance ratio of the main path MPA and the mirror path MIP, a current controlling unit 300 controlling a control current Ic flowing through the main path MAP with a pre-set constant current, a voltage adjusting unit 400 providing a bias adjustment signal that corresponds to a difference voltage between a first voltage V1 of a first node N1 on the main path MAP to which a current is output from the resistor mirror circuit 200 and a second voltage V2 of a second node N2 on the mirror path MIP to which a current is output from the resistor mirror circuit 200, and a bias circuit unit 500 adjusting a bias of a power amplifying unit 600 according to the bias adjustment signal from the voltage adjusting unit 400.

First, in the transistor mirror circuit 100, in a first current control mode, resistance of each of the main path MAP and the mirror path MIP is varied according to the gate voltage Vg, and accordingly, currents respectively flowing through the main path MAP and the mirror path MIP connected in parallel to the power source terminal Vbat may be adjusted.

Also, in the resistor mirror circuit 200, in a second current control mode discriminated from the first current control mode of the transistor mirror circuit 100, the respective currents on the main path MPA and the mirror path MIP may be adjusted according to a fixed resistance ratio on the main path MAP and the mirror path MIP.

The current controlling unit 300 may control the control current Ic flowing through the main path MAP by a pre-set constant current.

For example, the current controlling unit 300 may include an operational amplifier having a first input terminal that receives a bias control voltage, and a second input terminal and an output terminal, and a PMOS FET having a source connected to the first node N1, a gate connected to the output terminal of the operational amplifier, and a drain connected to a ground through ground resistor.

Here, the operational amplifier operates such that voltages at the two input terminals thereof are equal, so the bias control voltage and a voltage applied to the ground resistor are equal, and accordingly, a control current flowing through the ground resistor may be determined according to the ground resistor and the bias control voltage.

Also, the voltage adjusting unit 400 provides a bias adjustment signal that corresponds to a difference voltage between the first voltage V1 of the first node N1 and the second voltage V2 of the second node N2, to the bias circuit unit 500.

For example, the voltage adjusting unit 400 may be configured as an operational amplifier having a first input terminal receiving the first voltage V1 applied to the first node N1, a second input terminal receiving the second voltage V2 applied to the second node N2, and an output terminal providing a bias adjustment signal that corresponds to a difference voltage between the first voltage input to the first input terminal and the second voltage input to the second input terminal.

Here, the operational amplifier of the voltage adjusting unit 400 may provide the bias control signal that corresponds to the difference voltage between the first voltage V1 and the second voltage V2 to the bias circuit unit 500.

Subsequently, the bias circuit unit 500 may adjust the bias of the power amplifying unit 600 according to the bias adjustment signal input from the voltage adjusting unit 400.

The power amplifying unit 600 amplifies power of an RF signal RFin input through an input terminal IN and outputs a signal RFout through an output terminal OUT.

Here, the output terminal OUT is connected to the second node N2 on the main path MAP.

Figure 2:
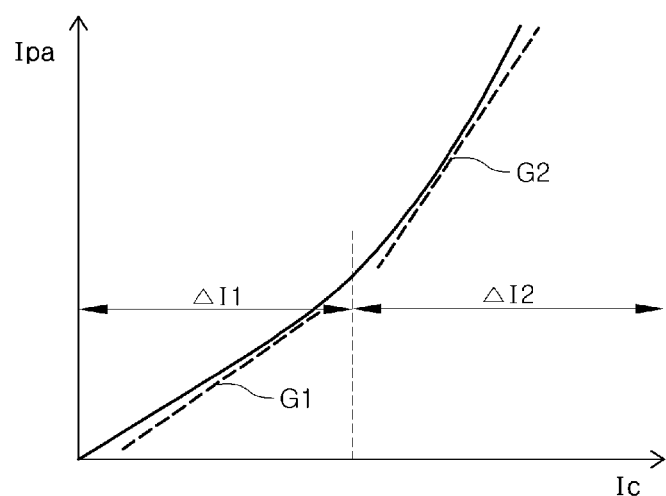
FIG. 2 is a graph illustrating current control modes of the power amplifying apparatus according to an embodiment of the present invention.

FIG. 2 is a graph illustrating current control modes of the power amplifying apparatus according to an embodiment of the present invention.

With reference to FIGS. 1 and 2, in the transistor mirror circuit 100, in the first current control mode in which the control current Ic is lower than a pre-set reference current Iref, a voltage drop is small due to a low current in the resistor mirror circuit 200, so the transistor mirror circuit 100 may dominantly adjust the current flowing through the mirror path MIP over the resistor mirror circuit 200.

Accordingly, in the first current control mode in which the control current Ic is lower than the pre-set reference current Iref, a noise floor that may be generated in the resistor mirror scheme may be prevented, thus improving a signal-to-noise ratio.

Meanwhile, in the resistor mirror circuit 200, in the second current control mode in which the control current Ic is higher than the pre-set reference current Iref, a voltage drop is large due to a high current, so the resistor mirror circuit 200 may dominantly control the current flowing through the mirror path MIP over the transistor mirror circuit 100.

Accordingly, in the second current control mode in which the current control Ic is higher than the pre-set reference current Iref, RF signal interference that may be generated in the transistor mirror scheme may be prevented, thus achieving resistance to RF signal interference.

Also, with reference to FIG. 2, G1 depicts a first relationship between the control current Ic and a driving current Ipa in the first current control mode $^\Delta$I1. In the first current control mode $^\Delta$I1, the transistor mirror circuit 100 may control the driving current according to the first relationship G1.

As described above, with reference to the first relationship G1 as illustrated in FIG. 2, in the first current control mode, a noise floor that may be generated in the resistor mirror scheme may be prevented, thus improving a signal-to-noise ratio.

Also, with reference to FIG. 2, G2 depicts a second relationship between the control current Ic and the driving current Ipa in the second current control mode $^\Delta$I2. In the second current control mode $^\Delta$I2, the resistor mirror circuit 200 may control the driving current according to the second relationship G2.

As described above, with reference to the second relationship G2 as illustrated in FIG. 2, in the second current control mode, RF signal interference that may be generated in the transistor mirror scheme may be prevented, thus achieving resistance to RF signal interference.

The transistor mirror circuit 100 according to an embodiment of the present invention will now be described in detail with reference to FIGS. 1 and 2.

The transistor mirror circuit 100 may include a first MOS FET PM1 formed on the main path MAP and having a source connected to the power source terminal Vbat, a gate connected to the gate voltage Vg, and a drain, and a second MOS FET PM2 formed on the mirror path MIP and having a source connected to the power source terminal Vbat, a gate connected to the gate voltage Vg, and a drain.

Here, the first and second MOS FETs PM1 and PM2 may have a pre-set gate size ratio for pre-set current mirroring. Namely, the second MOS FET PM2 may have a gate size larger than that of the first MOS FET PM1.

For example, in adjusting the ratio between the control current Ic flowing through the first MOS FET PM1 and the driving current Ipa flowing through the second MOS FET PM2, in a case in which the ratio between the gate sizes of the first and second MOS FETs PM1 and PM2 is 1:1000, the ratio between the control current Ic and the driving current Ipa may be adjusted to be 1:1000, like that of the gate size between the first and second MOS FETs PM1 and PM2.

Here, when the control current Ic is 1 mA, the driving current Ipa may be adjusted to be 1 A.

The resistor mirror circuit 200 according to an embodiment of the present invention will now be described in detail with reference to FIGS. 1 and 2.

The resistor mirror circuit 200 may include a first resistor R1 having one end connected to the drain of the first MOS FET PM1 and a second resistor R2 having one end connected to the drain of the second MOS FET PM2.

Here, the first and second resistors R1 and R2 may have a pre-set resistance ratio for pre-set current mirroring. Here, the second resistor R2 may have a resistance value smaller than that of the first resistor R1.

For example, when a resistance ratio between the first and second resistors R1 and R2 is 1000:1, the ratio between the control current Ic flowing through the first resistor R1 and the driving current Ipa flowing through the second resistor R2 may be determined to be 1:1000.

Here, when the control current Ic is 1 mA, the driving current Ipa may be adjusted to be 1 A.

As set forth above, according to embodiments of the invention, since the power amplifying apparatus can operate in one of two different current control modes according to a control current magnitude, when the control current is lower than a pre-set reference current, the current of the current amplifying unit is adjusted by the transistor mirror circuit which operates dominantly over the resistor mirror circuit, thus improving a signal-to-noise ratio.

Also, when the control current is higher than the pre-set reference current, the current of the current amplifying unit is adjusted by the resistor mirror circuit which operates dominantly over the transistor mirror circuit, thus reducing RF signal interference.

While the present invention has been shown and described in connection with the embodiments, it will be apparent to those skilled in the art that modifications and variations can be made without departing from the spirit and scope of the invention as defined by the appended claims.

What is claimed is:
1. A power amplifying apparatus comprising:
 a transistor mirror circuit adjusting currents respectively flowing through a main path and a mirror path, connected in parallel to a power source terminal, according to variable resistance varying according to a gate voltage;
 a resistor mirror circuit connected to the transistor mirror circuit and adjusting the respective currents of the main path and the mirror path according to a fixed resistance ratio of the main path and the mirror path;

a current controlling unit controlling a control current flowing through the main path with a pre-set constant current;

a voltage adjusting unit providing a bias adjustment signal that corresponds to a difference voltage between a first voltage of a first node on the main path to which a current is output from the resistor mirror circuit and a second voltage of a second node on the mirror path to which a current is output from the resistor mirror circuit; and a bias circuit unit adjusting a bias of a power amplifying unit according to the bias adjustment signal from the voltage adjusting unit.

2. The power amplifying apparatus of claim 1, wherein the transistor mirror circuit dominantly adjusts the current flowing through the mirror path over the resistor mirror circuit when the control current is lower than a pre-set reference current, and the resistor mirror circuit dominantly adjusts the current flowing through the mirror path over the transistor mirror circuit when the control current is higher than the pre-set reference current.

3. The power amplifying apparatus of claim 2, wherein the transistor mirror circuit includes:
   a first MOS FET formed on the main path and having a source connected to the power source terminal, a gate connected to the gate voltage, and a drain; and
   a second MOS FET formed on the mirror path and having a source connected to the power source terminal, a gate connected to the gate voltage, and a drain.

4. The power amplifying apparatus of claim 3, wherein the first and second MOS FETs have a pre-set gate size ratio for pre-set current mirroring.

5. The power amplifying apparatus of claim 4, wherein the second MOS FET has a gate size larger than that of the first MOS FET.

6. The power amplifying apparatus of claim 3, wherein the resistor mirror circuit includes:
   a first resistor having one end connected to the drain of the first MOS FET; and
   a second resistor having one end connected to the drain of the second MOS FET.

7. The power amplifying apparatus of claim 6, wherein the first and second resistors have a pre-set resistance ratio for pre-set current mirroring.

8. The power amplifying apparatus of claim 7, wherein the second resistor has a resistance value smaller than that of the first resistor.

9. A power amplifying apparatus comprising:
   a transistor mirror circuit adjusting currents respectively flowing through a main path and a mirror path connected in parallel to a power source terminal, according to variable resistance varying according to a gate voltage;
   a resistor mirror circuit connected to the transistor mirror circuit and adjusting the respective currents of the main path and the mirror path according to a fixed resistance ratio of the main path and the mirror path;
   a current controlling unit controlling a control current flowing through the main path with a pre-set constant current;
   a voltage adjusting unit providing a bias adjustment signal that corresponds to a difference voltage between a first voltage of a first node on the main path to which a current is output from the resistor mirror circuit and a second voltage of a second node on the mirror path to which a current is output from the resistor mirror circuit; and
   a bias circuit unit adjusting a bias of a power amplifying unit according to the bias adjustment signal from the voltage adjusting unit,
   wherein the transistor mirror circuit includes:
      a first MOS FET formed on the main path and having a source connected to the power source terminal, a gate connected to the gate voltage, and a drain; and
      a second MOS FET formed on the mirror path and having a source connected to the power source terminal, a gate connected to the gate voltage, and a drain, and the resistor mirror circuit includes:
      a first resistor having one end connected to the drain of the first MOS FET; and
      a second resistor having one end connected to the drain of the second MOS FET.

10. The power amplifying apparatus of claim 9, wherein the transistor mirror circuit dominantly adjusts the current flowing through the mirror path over the resistor mirror circuit when the control current is lower than a pre-set reference current, and the resistor mirror circuit dominantly adjusts the current flowing through the mirror path over the transistor mirror circuit when the control current is higher than the pre-set reference current.

11. The power amplifying apparatus of claim 10, wherein the first and second MOS FETs have a pre-set gate size ratio for pre-set current mirroring.

12. The power amplifying apparatus of claim 11, wherein the second MOS FET have a gate size larger than that of the first MOS FET.

13. The power amplifying apparatus of claim 10, wherein the first and second resistors have a pre-set resistance ratio for pre-set current mirroring.

14. The power amplifying apparatus of claim 13, wherein the second resistor has a resistance value smaller than that of the first resistor.

* * * * *